United States Patent [19]

Goel

[11] 4,183,041
[45] Jan. 8, 1980

[54] SELF BIASING OF A FIELD EFFECT TRANSISTOR MOUNTED IN A FLIP-CHIP CARRIER

[75] Inventor: Jitendra Goel, Kendall Park, N.J.

[73] Assignee: RCA Corporation, New York, N.Y.

[21] Appl. No.: 919,069

[22] Filed: Jun. 26, 1978

[51] Int. Cl.² .................. H01L 29/80; H01L 27/02; H01L 23/02
[52] U.S. Cl. .......................... 357/81; 357/80; 357/22; 357/51; 357/74; 333/247
[58] Field of Search ............ 357/22, 71, 80, 81, 357/69, 74, 51; 333/246, 247

[56] References Cited

U.S. PATENT DOCUMENTS

| | | | |
|---|---|---|---|
| 3,235,945 | 2/1966 | Hall et al. | 357/71 |
| 3,368,116 | 2/1968 | Spaude | 357/80 |
| 3,387,190 | 6/1968 | Winkler | 357/81 |
| 3,713,006 | 1/1973 | Litty et al. | 357/81 |
| 3,733,525 | 5/1973 | Robinson et al. | 357/80 |
| 3,781,613 | 12/1973 | Robinson | 357/80 |
| 3,825,805 | 7/1974 | Belohoubeck et al. | 357/81 |
| 3,877,063 | 4/1975 | Abraham et al. | 357/69 |
| 4,135,168 | 1/1979 | Wade | 357/71 |

Primary Examiner—Andrew J. James
Attorney, Agent, or Firm—H. Christoffersen; Samuel Cohen; Joseph D. Lazar

[57] ABSTRACT

A field effect transistor is mounted in a flip-chip carrier which is in contact with one surface of a metal plate, the other surface of the plate being in contact with one surface of a block of beryllium oxide. A metal sheet, connected to a ground plane, is in contact with the one surface of the block and the surface of the block opposed therefrom. The plate and the sheet have a space therebetween. A film resistor is disposed upon the block in the space.

3 Claims, 3 Drawing Figures

SELF BIASING OF A FIELD EFFECT TRANSISTOR MOUNTED IN A FLIP-CHIP CARRIER

BACKGROUND OF THE INVENTION

1. Field of Invention

This invention relates to electronic circuitry and more particularly to connecting a field effect transistor to a flip-chip carrier.

2. Description of the Prior Art

The amount of power that can be provided by a field effect transistor (FET) is limited by the amount of power that the FET can safely dissipate. When the FET is mounted in a heat sink, there is a large increase in the amount of power that can be safely dissipated and, correspondingly, a large increase in the amount of power that can be provided. In one particular arrangement, the FET is mounted in a flip-chip carrier type of heat sink. The flip-chip carrier is referred to and shown in the article, "Thermal resistance of GaAs Power FETs" by H. C. Huang, F. N. Sechi and L. S. Napoli in the Proceedings of the Sixth Biennial Cornell Electrical Engineering Conference (1977).

To understand the mounting of the FET in the carrier, it should be understood that the FET is comprised of a plurality of unit transistors with a substrate common to all of the unit transistors.

An exemplary unit transistor includes three elements, one of which is a thin metal deposition, known as a unit gate, that forms a Schottky barrier junction with the substrate. The other two elements, known as a unit drain and a unit source, respectively, are each a thin metal deposition in ohmic contact with the substrate.

The unit sources usually have metal posts plated thereon that are axially perpendicular to the substrate. The distal surfaces of the posts have displacements from the substrate greater than the displacements of the distal surfaces of the unit gates and the unit drains. The FET is mounted with the distal surfaces of the posts in contact with a flat surface of the carrier. Because the distal surfaces of the posts have the greater displacement from the substrate, the flat surface does not make contact with either the unit gates or the unit drains.

The carrier is typically connected to a ground plane, such that all of the unit sources form a grounded source electrode of the FET. Since a wire is not used to connect the source electrode to ground, there is no introduction of an undesirable inductance in series with the source electrode, as found in other heat sink arrangements.

It is often desirable to introduce a resistor, in parallel with a capacitor, between the source electrode and ground. A DC bias current flows through the resistor to establish a voltage between the source electrode and ground thereby obviating a need for a bias power supply. Additionally, when the bias current increases, for example, the source to ground voltage increases thereby tending to decrease the bias current. Accordingly, the resistor introduces a negative feedback that tends to stabilize the bias current thereby making the operation of the FET uniform over a wide temperature range.

The use of the resistor and the capacitor is known as self biasing. However, self biasing is inconsistent with the connection of the source electrode to ground through the carrier. Heretofore, concurrently obtaining the advantages of self biasing and the flip-chip carrier has been unknown in the prior art.

SUMMARY OF THE INVENTION

According to the present invention, a field effect transistor (FET) is mounted in a flip-chip carrier such that the source electrode of the FET is connected to the carrier. A metal plate has one surface in contact with the carrier, the other surface of the plate being in contact with one surface of a block of beryllium oxide. A metal sheet connected to a ground plane is in contact with the one surface of the block and the surface of the block opposed therefrom. The plate and the sheet have a space therebetween. A film resistor is disposed upon the block in the space.

DESCRIPTION OF THE PREFERRED EMBODIMENT

Figure 1:
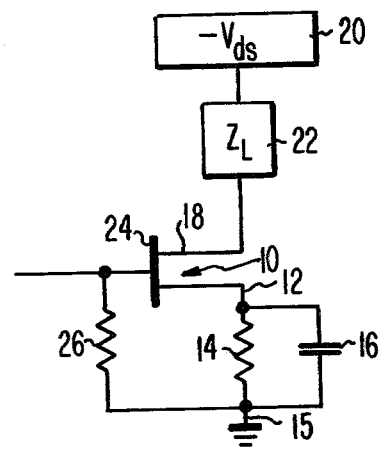
FIG. 1 is a schematic diagram of the preferred embodiment of the present invention.

As shown in FIG. 1, a field effect transistor (FET) 10 is connected at the source (S) electrode 12 thereof through a bias resistor 14 to a ground 15. A by-pass capacitor 16 is connected in parallel with resistor 14. It should be understood that capacitor 16 provides substantially a short circuit between source electrode 12 and ground 15 to all signal currents that are conducted through FET 10.

The drain (D) electrode 18 of FET 10 is connected to a negative DC power supply ($-V_{ds}$) 20 through a load impedance 22. The gate (G) electrode 24 of FET 10 is connected to ground 15 through a resistor 26. Since current does not flow through gate electrode 24, gate electrode 24 is at ground potential.

A DC bias current flows from ground through resistor 14 and FET 10 to drain 18. The bias current establishes a DC operating voltage between gate electrode 24 and source electrode 12 in accordance with a relationship which is given as:

$$V_{GS} = IR \tag{1}$$

where $V_{GS}$ is the DC operating voltage between gate electrode 24 and source electrode 12;

I is the bias current; and

R is the resistance of resistor 14.

Accordingly, FET 10 is self biased.

As explained hereinafter, although source electrode 12 is connected to ground 15 through resistor 14 and capacitor 16, FET 10 is mounted on a flip-chip carrier (28) that thermally couples source electrode 12 to ground 15 through a low thermal resistance path, thereby concurrently providing the advantages of the flip-chip carrier and the self biasing.

Figure 2:
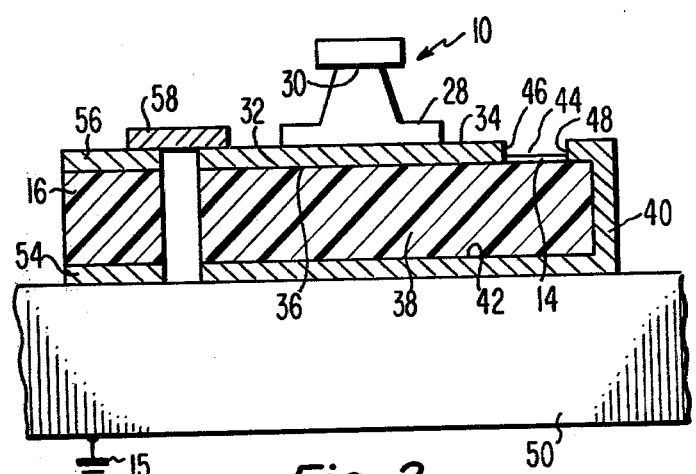
FIG. 2 is a side elevation of structural elements of the embodiment of FIG. 1.

As shown in FIG. 2, FET 10 is connected to a brass flip-chip carrier 28 at the top surface 30 thereof. As explained hereinafter, carrier 28 is connected to source electrode 12 (FIG. 1).

A brass plate 32 is sandwiched between the bottom surface 34 of carrier 28 and a surface 36 of a a beryllium oxide block 38. As known to those skilled in the art, beryllium oxide is an electrical insulator having a thermal resistance that approximates the thermal resistance of brass.

A brass sheet 40 is formed to contact surface 36 and a surface 42 of block 38, surfaces 36 and 42 being opposite each other. A predetermined space 44 separates edges 46 and 48 of plate 32 and sheet 40, respectively.

Sheet 40 rests upon a brass block 50 that is connected to ground 15. Since the thermal resistance of a beryllium oxide approximates the thermal resistance of brass, and plate 32 and sheet 40 are all made from brass, a low thermal resistance path is provided from source electrode 12 to block 50. Moreover, because of space 44, carrier 28, and hence source electrode 12, are electrically insulated from ground 15.

Resistor 14 is formed by a film deposition upon surface 36 within space 44. The film is in contact with edges 46 and 48. The film may be either of the cermet type or of any other suitable type. Resistor 14 typically has a resistance on the order of five ohms.

Capacitor 16 has one plate 54 that is in an abutting relationship with block 50. The other plate 56 of capacitor 16 is connected to plate 32 by a brass ribbon 58. Capacitor 16 is thereby connected to provide a short circuit to signals from plate 32 to ground 15. Preferably, capacitor 16 and block 38 are closely spaced.

Figure 3:
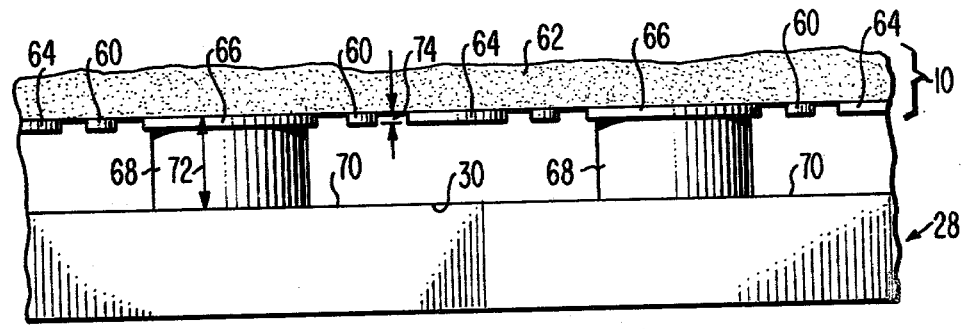
FIG. 3 is a side elevation, partly in section, of a transistor and a flip-chip carrier shown in FIG. 2.

As shown in FIG. 3, transistor 10 is comprised of a plurality of unit gates 60 disposed upon an N-type gallium arsenide substrate 62. Unit gates 60 are metal depositions that form Schottky barrier junctions with substrate 62. Unit gates 60 are all connected together by a metal deposition (not shown) on substrate 62, thereby forming gate electrode 24.

FET 10 additionally includes a plurality of unit drains 64 and a plurality of unit sources 66 disposed upon substrate 62 in ohmic contact therewith. Moreover, drains 64 are connected together by a metal deposition (not shown) on substrate 62, thereby forming drain electrode 18.

Unit sources 66 each have a plating thereon that forms posts 68. The distal ends 70 of posts 68 have a displacement 72 from substrate 62. Displacement 72 is much larger than a displacement 74 of the distal ends of unit gates 60 and unit drains 64 from substrate 62.

Distal ends 70 are in an abutting relationship with surface 30, thereby establishing the connection between FET 10 and carrier 28 and forming source electrode 12.

Since displacement 72 is larger than displacement 74, there is no contact between either unit sources 60 or unit drains 64 and surface 30.

What is claimed is:

1. A circuit that includes a field effect transistor having pluralities of unit gates, unit drains and unit sources disposed upon a substrate, said unit sources being plated with an electrically conductive material to form posts on said unit sources with distal surfaces having a displacement from said substrate greater than the displacement of the distal surfaces of said unit gates and said unit drains from said substrate, said distal ends of said posts being in contact with the top surface of a flip-chip carrier, the improvement comprising:

a block of an electrically insulating material having a thermal resistance that approximates the thermal resistance of brass;

a metal plate having first and second surfaces in contact with one surface of said block and the bottom surface of said carrier, respectively, whereby said plate is between said block and said carrier;

a metal sheet formed for contact with said one surface of said block and a surface of said block opposed therefrom, said sheet extending over said one surface of said block sufficiently only to provide a gap for a discontinuity in the electrical conduction path through said metal sheet and said metal plates;

a block of brass having one surface in thermal and electrical contact with said opposed surface of said metal sheet, said block serving as the ground plane of said circuit; and a film resistor disposed upon said block between said gap and on the surface of said insulating block, said resistor connecting said metal plate and said metal sheet to provide thereby an electrical resistance between said unit sources for self-biasing said transistor whereby said unit sources are thermally coupled by the low thermal resistance path formed by said metal plate, said metal sheet and said insulating and brass blocks.

2. The circuit of claim 1 wherein said block is comprised of beryllium oxide.

3. The circuit of claim 1 additionally comprising a capacitor having one plate connected to said plate and the other plate connected to the ground plane.

* * * * *